United States Patent
Barsukou

(10) Patent No.: US 12,316,297 B2
(45) Date of Patent: May 27, 2025

(54) INTERDIGITAL TRANSDUCER ELECTRODE FOR ACOUSTIC WAVE DEVICE WITH IMPROVED RESPONSE

(71) Applicant: SKYWORKS SOLUTIONS, INC., Irvine, CA (US)

(72) Inventor: Siarhei Dmitrievich Barsukou, Takarazuka (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 279 days.

(21) Appl. No.: 17/938,719

(22) Filed: Oct. 7, 2022

(65) Prior Publication Data

US 2023/0112487 A1    Apr. 13, 2023

Related U.S. Application Data

(60) Provisional application No. 63/254,645, filed on Oct. 12, 2021.

(51) Int. Cl.
*H03H 9/02* (2006.01)
*H03H 3/08* (2006.01)
*H03H 9/145* (2006.01)
*H03H 9/64* (2006.01)

(52) U.S. Cl.
CPC .......... *H03H 9/02228* (2013.01); *H03H 3/08* (2013.01); *H03H 9/14547* (2013.01); *H03H 9/6483* (2013.01)

(58) Field of Classification Search
CPC ........ H03H 9/132; H03H 9/6483; H03H 3/08; H03H 9/02228; H03H 9/14547; H03H 3/02
See application file for complete search history.

(56) References Cited

U.S. PATENT DOCUMENTS

| | | | |
|---|---|---|---|
| 2013/0187729 A1* | 7/2013 | Adkisson | G06F 30/398 333/186 |
| 2016/0182009 A1* | 6/2016 | Bhattacharjee | H03H 9/02574 310/313 R |
| 2016/0352304 A1* | 12/2016 | Kadota | H03H 9/02559 |

(Continued)

OTHER PUBLICATIONS

Pashchenko et al., "Effective SAW excitation on non-piezoelectric substrate using AlScN piezoelectric thin film BAW/SAW hybrid transducer," 2017 IEEE International Ultrasonics Symposium (IUS), 2017.

(Continued)

*Primary Examiner* — Quan Tra
(74) *Attorney, Agent, or Firm* — Lando & Anastasi, LLP

(57) ABSTRACT

An interdigital transducer increased propagation frequency and a method for making the same is described. The transducer comprises a substrate for propagation of acoustic waves comprising a first surface having alternating high and low surface portions extending laterally across the substrate, a set of elongate first electrodes, each first electrode disposed on a respective high surface portion and a set of elongate second electrodes, each second electrode disposed on a respective low surface portion such that the first and second electrodes are alternately adjacent to one another, the high and low surface portions being substantially equal in width to each electrode of the first and second sets of electrodes.

17 Claims, 9 Drawing Sheets

(56) References Cited

U.S. PATENT DOCUMENTS

2024/0171151 A1* 5/2024 Okunaga ................ H03H 9/175

OTHER PUBLICATIONS

Plessky et al., "Comb Transducer for Generation of SH0 Mode in Crystalline Piezoelectric Membrane," 2020 IEEE International Ultrasonics Symposium (IUS), 2020, pp. 1-4.
Zou et al., "The Multi-Mode Resonance in AlN Lamb Wave Resonators," Journal of Microelectromechanical Systems, vol. 27, No. 6, pp. 973-984, Dec. 2018.
Zou et al., "Transducer design for AlN Lamb wave resonators," Journal of Applied Physics 121, 154502 (2017). [http://dx.doi.org/10.1063/1.4979914].

* cited by examiner

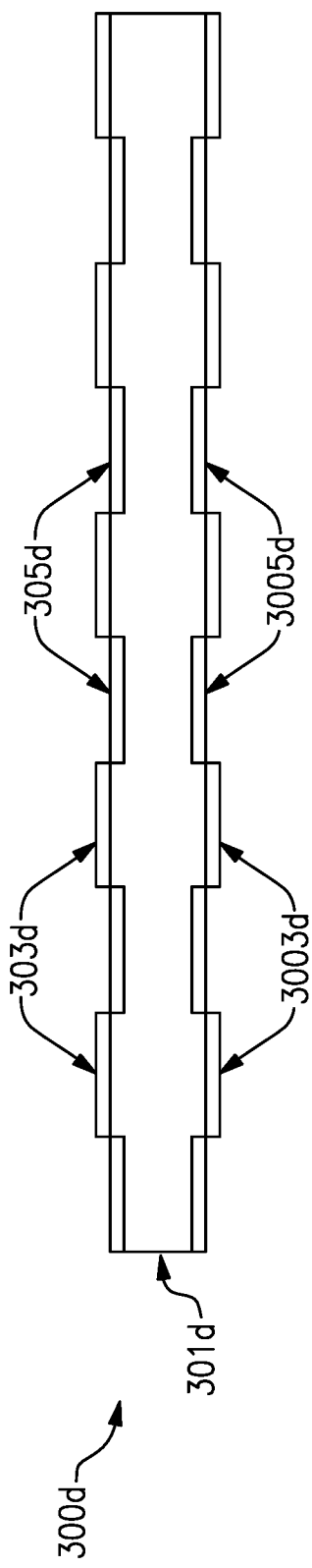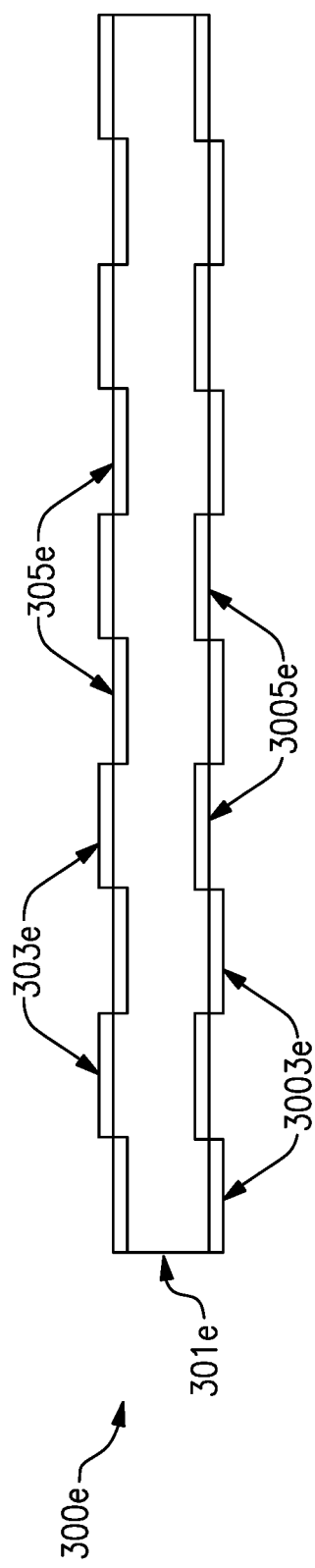

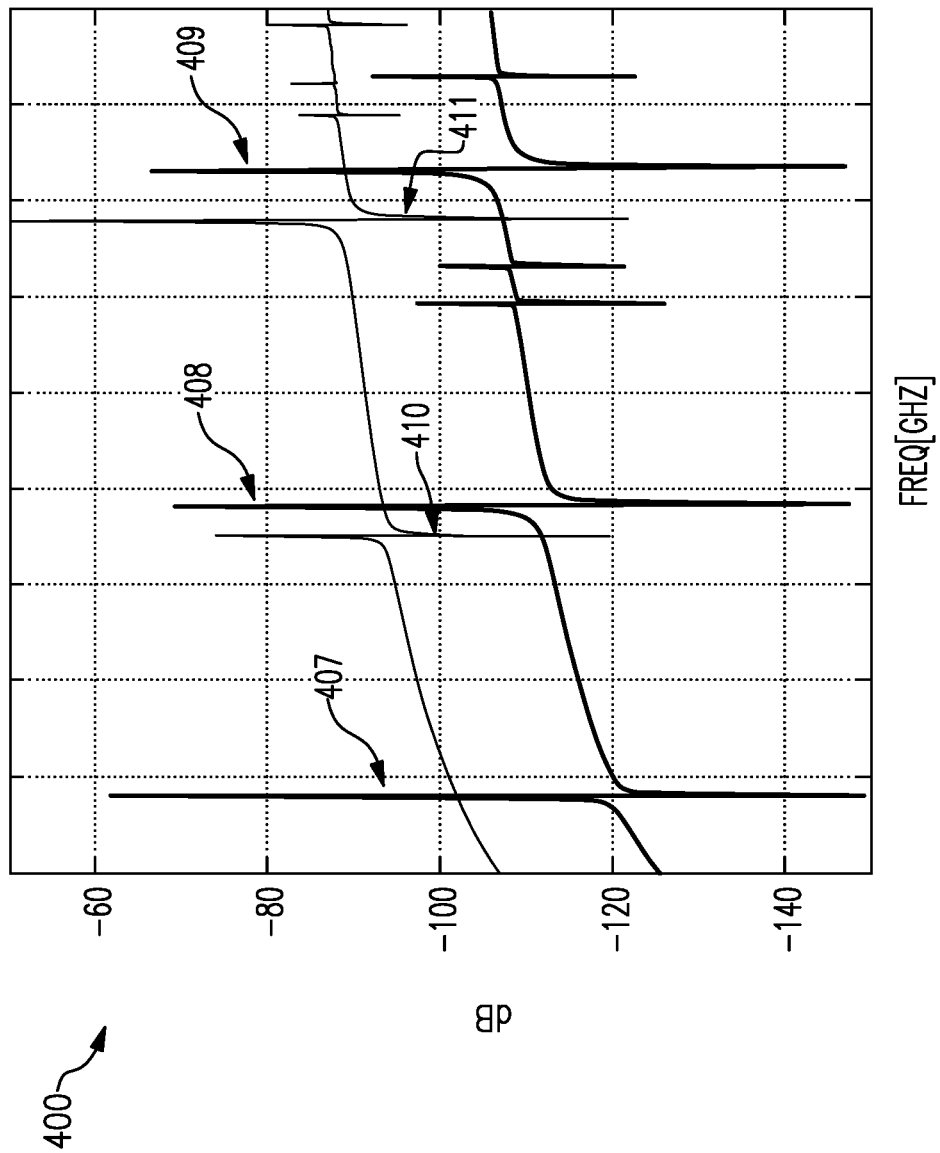

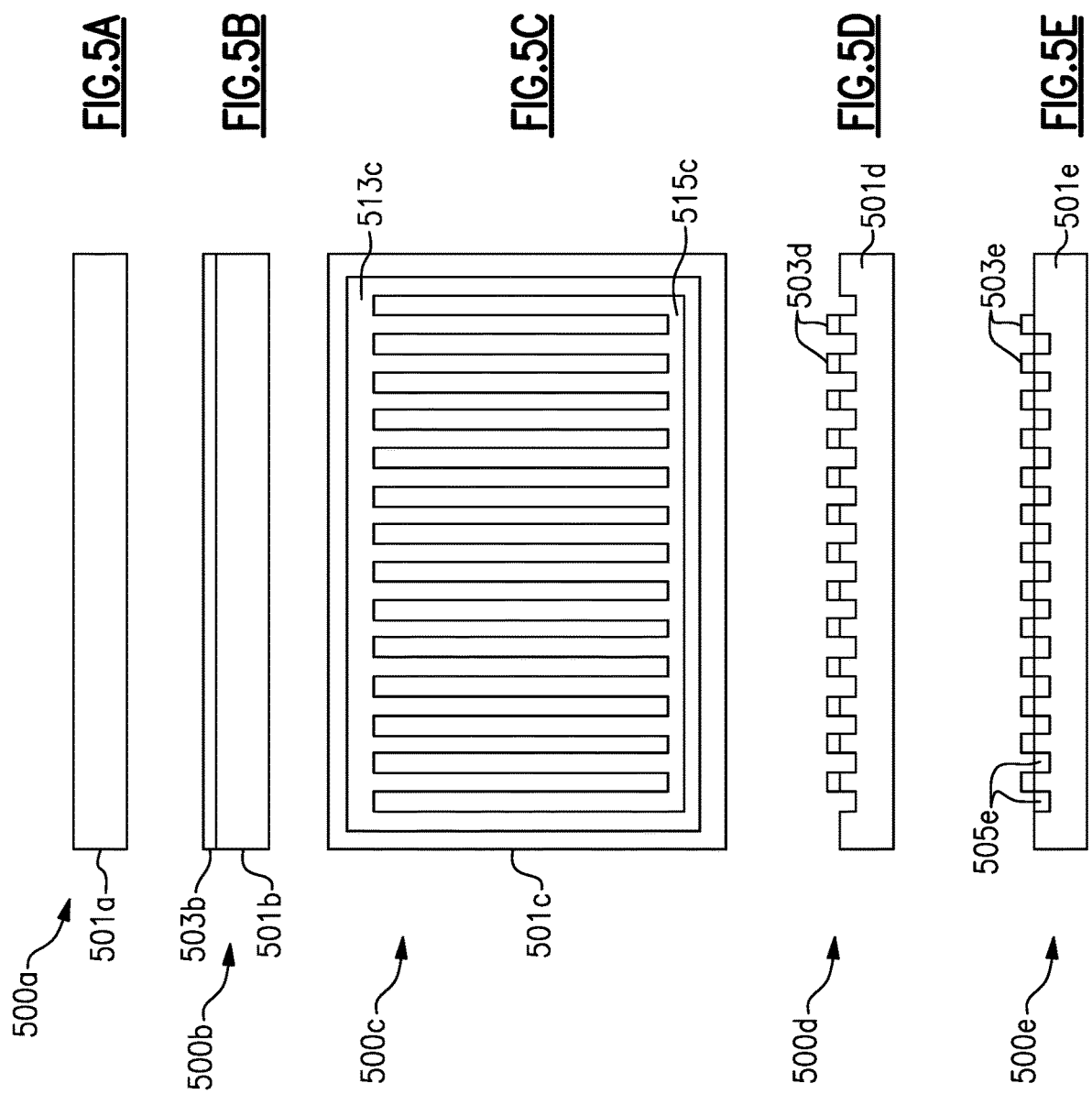

INTERDIGITAL TRANSDUCER ELECTRODE FOR ACOUSTIC WAVE DEVICE WITH IMPROVED RESPONSE

CROSS-REFERENCE TO RELATED APPLICATIONS

This application claims priority under 35 U.S.C. § 119(e) to U.S. Provisional Patent Application Ser. No. 63/254,645, titled "INTERDIGITAL TRANSDUCER ELECTRODE FOR ACOUSTIC WAVE DEVICE WITH IMPROVED RESPONSE," filed Oct. 12, 2021, the entire contents of which is incorporated herein by reference for all purposes.

BACKGROUND

Field

Aspects and embodiments disclosed herein relate to interdigital transducer electrodes (IDTs) for acoustic wave devices that provide the acoustic wave devices with an improved response and simplify the method of manufacturing same.

Description of the Related Technology

In known acoustic wave devices, one may attempt to provide frequency and quality improvements by increasing the number of electrodes forming the IDTs of each device. This has been attempted by applying electrodes to both sides of a substrate, by creating castellated arrays with electrodes at the surface and underneath, by using large floating electrodes on the underside of the substrate, and in other ways as shown in FIGS. 1A to 1F. In these prior art examples, it becomes overly complicated to manufacture the devices. By applying multiple sets of electrodes on different sides of the device, where the specific relative locations of each electrode is critical, it becomes non-trivial to align the substrates for multiple applications. Furthermore, in some of the prior art devices which attempt to overcome this problem, there are further issues due to propagation losses caused by large vertical separation between sets of electrodes.

SUMMARY

According to one embodiment there is provided an interdigital transducer with increased propagation frequency. The interdigital transducer comprises a substrate for propagation of acoustic waves including a first surface having alternating high and low surface portions extending laterally across the substrate, a set of elongate first electrodes, each first electrode disposed on a respective high surface portion, and a set of elongate second electrodes, each second electrode disposed on a respective low surface portion such that the first and second electrodes are alternately adjacent to one another, the high and low surface portions being substantially equal in width to each electrode of the first and second sets of electrodes.

In one example, the interdigital transducer further comprises a second surface having alternating high and low surface portions extending laterally across the substrate.

In one example, the interdigital transducer further comprises a set of elongate third electrodes, each third electrode disposed on a respective high portion of the second surface.

In one example, the interdigital transducer further comprises a set of elongate fourth electrodes, each fourth electrode disposed on a respective low portion of the second surface, such that the third and fourth electrodes are alternately adjacent to one another, the high and low surface portions being substantially equal in width to each electrode of the third and fourth sets of electrodes.

In one example, the duty factor of the electrodes disposed on the substrate is equal to or greater than 0.98.

In one example, the first set of electrodes are connected by a busbar disposed on a high surface portion extending longitudinally across the substrate.

In one example, the second set of electrodes are connected by a busbar disposed on a low surface portion extending longitudinally across the substrate.

In one example, the interdigital transducer further comprises a gap between each adjacent electrode.

In one example, the gap is smaller than 0.01 wavelengths of the propagated acoustic wave.

In one example, the substrate is made of any one of aluminum nitride, doped aluminum nitride, in particular scandium doped aluminum nitride, zinc oxide, lithium niobite, or any suitable piezoelectric material.

In one example, the sets of first and second electrodes are made of any one of aluminum, tungsten, copper, gold, silver, platinum, ruthenium, molybdenum, or other metals.

In one example, any one of the electrode sets are made of a different material to any of the other electrode sets.

In one example, the thickness of the substrate is equal to 0.1 to 1 times the wavelength of the acoustic waves.

In one example, the thickness of the substrate is equal to 0.3 times the wavelength of the acoustic waves.

In one example, the thickness of each electrode is equal to 0.01 to 0.5 times the wavelength of the acoustic waves.

In one example, the thickness of each electrode is equal to 0.03 times the wavelength of the acoustic waves.

According to another embodiment there is provided a method of providing a high frequency wave within an interdigital transducer comprising placing a first set of electrodes on a surface of a substrate and placing a second set of electrodes interleaved with the first set of electrodes beneath the surface of the substrate such that the space between the electrodes of the first set of electrodes is substantially filled by the electrodes of the second set of electrodes.

In one example, the frequency of the wave within the interdigital transducer is set by the pitch of the first and second sets of electrodes.

According to another embodiment there is provided a method of manufacturing an interdigital transducer with increased propagation frequency. The method comprises depositing a first interdigital transducer layer to substantially cover a substrate, applying a mask having a positive and negative area to the interdigital transducer layer, the mask forming the silhouette of an interdigital transducer electrode set in the positive area and forming an interleaving silhouette of an interdigital transducer electrode set in the negative area, removing the interdigital transducer layer exposed by the negative area by etching, removing a layer of substrate approximately equal to the thickness of the interdigital transducer layer exposed by the negative area by etching, and depositing a second interdigital transducer layer to substantially cover the substrate exposed by the negative area.

In one example, depositing the second interdigital transducer layer comprises leaving a gap equal to approximately 1/50 the width of each interdigital transducer electrode of the interdigital transducer electrode sets around the perimeter of the negative area of the mask where no second interdigital transducer layer is deposited.

In another embodiment there is provided a method of manufacturing an interdigital transducer with increased propagation frequency. The method comprises applying a mask having a positive and negative area to a substrate, the mask forming the silhouette of an interdigital transducer electrode set in the positive area and forming an interleaving silhouette of an interdigital transducer electrode set in the negative area, removing the substrate layer exposed by the negative area by etching, removing the mask, depositing an interdigital transducer layer to substantially cover the substrate, and finishing the interdigital transducer layer such to provide a substantially uniform thickness of interdigital transducer layer.

In another example, there is provided a terminal comprising a filter including an interdigital transducer according to claim 1.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures is represented by a like numeral. For purposes of clarity, not every component may be labeled in every figure. In the figures:

FIG. 3D is a cross-sectional view of an improved IDT according to another aspect of the present disclosure;
FIG. 3E is a cross-sectional view of an improved IDT according to another aspect of the present disclosure;
FIG. 4 is a plot showing the frequency response of an improved IDT compared to a prior art acoustic wave IDT;
FIG. 5A is a first step in the construction of an improved IDT according to an aspect of the present disclosure;
FIG. 5B is a subsequent step in the construction of an improved IDT according to an aspect of the present disclosure;
FIG. 5C is a subsequent step in the construction of an improved IDT according to an aspect of the present disclosure;
FIG. 5D is a subsequent step in the construction of an improved IDT according to an aspect of the present disclosure;
FIG. 5E is a subsequent step in the construction of an improved IDT according to an aspect of the present disclosure.

DETAILED DESCRIPTION

Aspects and embodiments described herein are directed to an Interdigital Transducer electrode (IDT) for an acoustic wave device. When constructing an acoustic wave device it is desired to use an IDT which generates high frequency acoustic waves, as these are useful for radio transmitters and the like. This can be achieved by placing electrodes which make up the IDTs closer together, thus reducing the wavelength of the acoustic wave generated by the IDT, because the wavelength of the acoustic wave generated by the IDT is set by the pitch of the electrodes.

Figure 1:
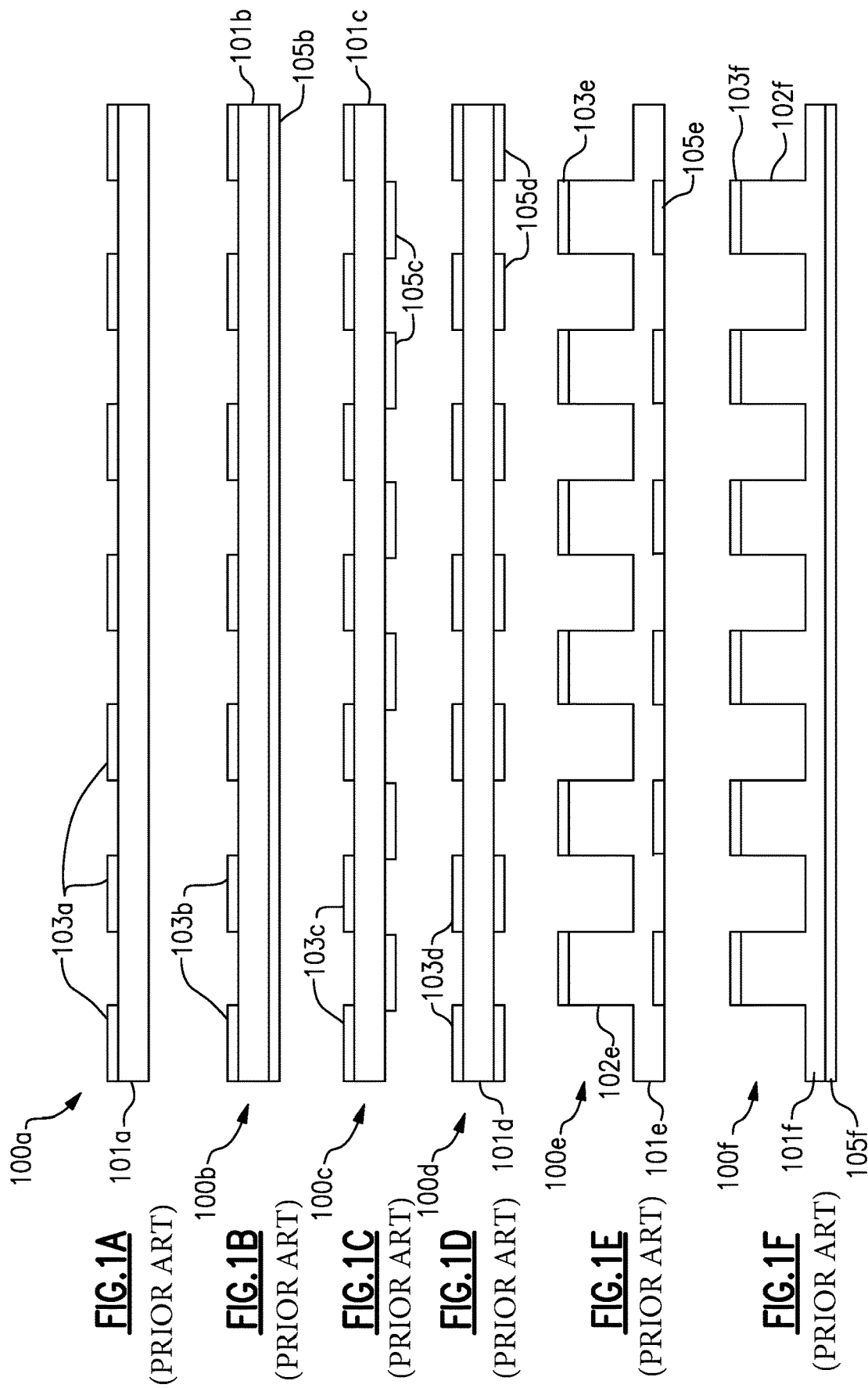
FIG. 1A is a cross-sectional diagram of a prior art IDT.
FIG. 1B is a cross-sectional diagram of a prior art IDT.
FIG. 1C is a cross-sectional diagram of a prior art IDT.
FIG. 1D is a cross-sectional diagram of a prior art IDT.
FIG. 1E is a cross-sectional diagram of a prior art IDT.
FIG. 1F is a cross-sectional diagram of a prior art IDT.

FIG. 1A shows a prior art IDT 100a suitable for an acoustic wave device which is arranged having conventional electrodes 103a. The electrodes are each in turn connected to an input signal and ground to generate an acoustic wave within a substrate 101a. The wavelength of the signal is set by the pitch of the electrodes of the IDT, such that a zero order (A0) asymmetrical acoustic wave is generated with a wavelength equal to twice the distance between electrodes, and a zero order (S0) symmetrical acoustic wave is generated with a wavelength approximately equal to the distance between each electrode. Instead of ground, the second sets of alternate electrodes can be connected to the opposite side of the signal input, i.e., the IDT could be connected to a signal input which is not connected to ground.

Therefore, to generate a higher frequency zero order wave, the size of the electrode pitches may be reduced. However, achievable dimensions are limited by the process resolution of the manufacturing process.

To reduce the wavelength of the generated first order acoustic wave a number of prior art solutions have been proposed, as shown in FIGS. 1B to 1F.

In FIG. 1B an electrode 105b of solid metal is disposed on the bottom side of a substrate 101b. The electrode 105b is on the opposite side of the substrate 101b to the electrodes 103b, which in this example are all connected to the input signal. The bottom electrode 105b is connected to ground.

In FIG. 1C a first set of electrodes 103c are connected to the input signal, and a second set of electrodes 105c are connected to ground and are disposed on the opposite side of the substrate 101c to the first set of electrodes 103c. It can be seen that the spacing between electrodes on any one side is the same as in the IDT 100a, but the effective horizontal spacing between all electrodes is half of that.

To obtain the expected benefits of half spacing the electrodes 103c and 105c the bottom electrodes 105c must be placed exactly opposite the spaces between their counterparts on the top side. This means that to manufacture the IDT, the substrate 101c must be aligned once to apply the top electrodes 103c and then aligned again, precisely, to apply the bottom electrodes 105c. The electrodes can be applied by depositing metal atop the whole substrate and then milling the excess away, or by masking and then depositing the electrode material in the spaces left by the mask.

Similarly, FIG. 1D shows a similar arrangement where the top 103d and bottom 105d electrodes are disposed opposite each other on the substrate, which has the same alignment restraints as the IDT 100c.

FIG. 1E shows an arrangement where a castellated structure 102e is disposed atop the substrate 101e, with first and second IDTs 103e and 105e located at the top of the castellation and also located directly underneath. The pole of each electrode is swapped in comparison to its horizontal and vertical neighbors, such that every other electrode is connected to either ground or the input signal. Similarly, FIG. 1F shows a castellated structure 102f where first electrodes 103f are located only at the top of the structure and a further floating electrode 105f is disposed on the opposite side of the substrate 101f.

In the prior art examples of FIGS. 1E and 1F there are problems with propagation losses and with reflectance from the castellated structure. In addition, these structures add manufacturing constraints and challenges which aren't present in usual IDT structures.

Figure 2:
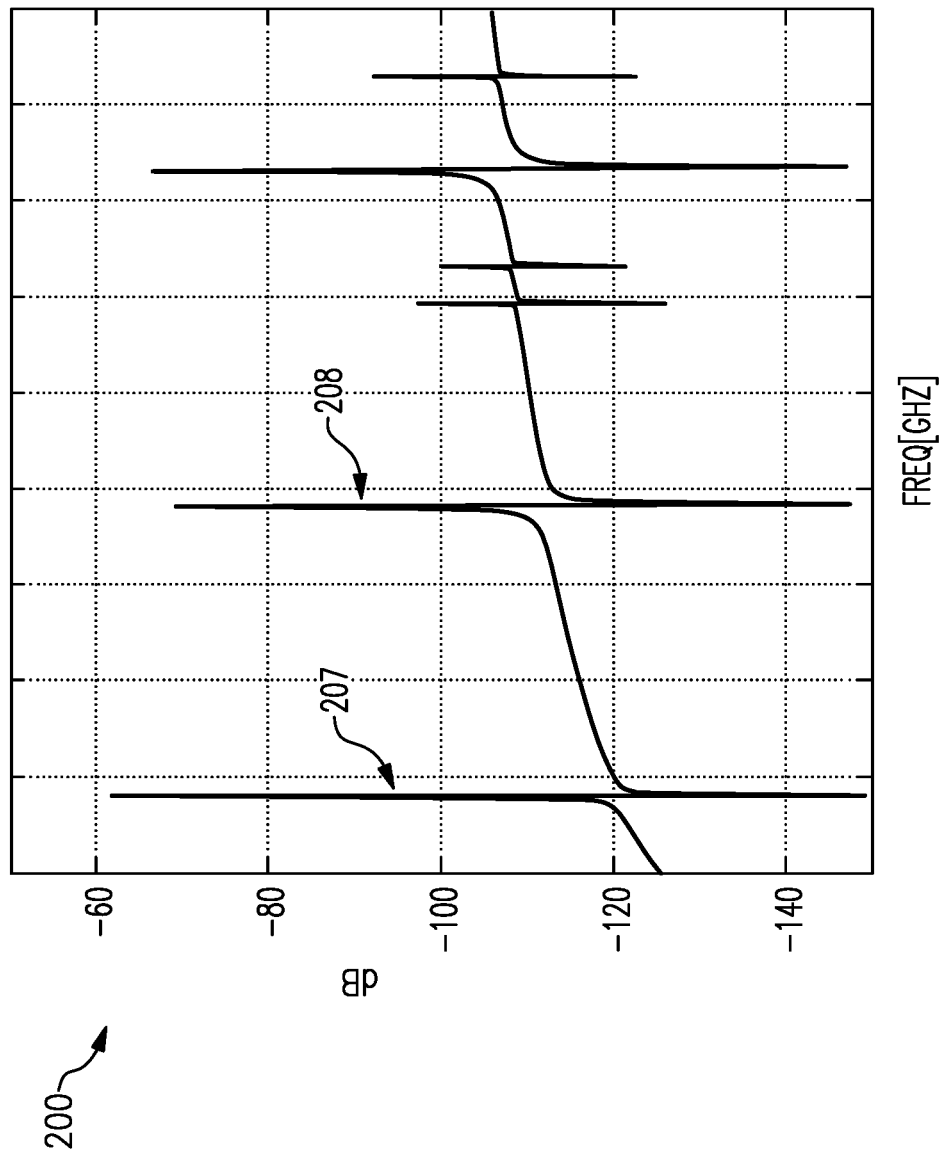
FIG. 2 is a plot showing the frequency response of a prior art IDT.

FIG. 2 shows a plot of the frequency and impedance response of a prior art acoustic wave device comprising an IDT such as IDT 100a. It can be seen that the first asymmetric Lamb wave form 207 generated by the IDT is at around 1700 MHz, and that the zero order symmetrical Lamb wave form 208 generated by the IDT is at around 4800 MHz.

It is preferable to operate the device around the S0 waveform 208, as this is better propagated by the acoustic wave device, has a lower attenuation, better parameter dispersion and a near twice higher frequency than the A0 Lamb wave mode. Furthermore, acoustic wave devices are more commonly used to process signals around the 8 to 10 GHz range. A device which generates an S0 Lamb wave in this frequency range is therefore desirable.

Figure 3A:
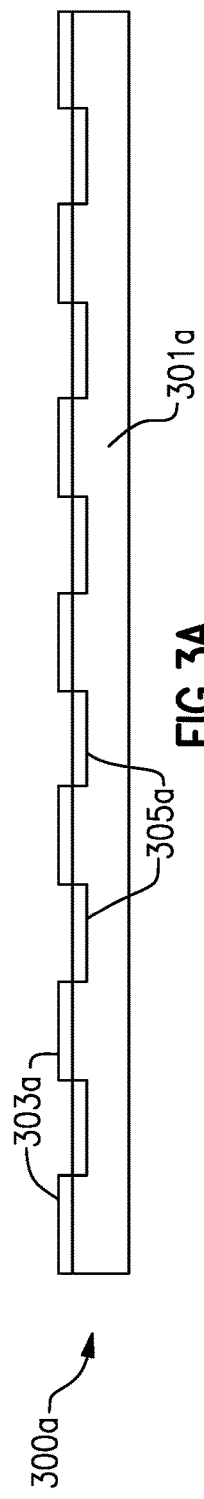
FIG. 3A is a cross-sectional view of an improved IDT according to an aspect of the present disclosure.

To generate this S0 wave mode at the desired high frequency, such as over 10 GHz, it is therefore helpful to reduce the pitch of the electrodes forming the IDT, however this is limited by the process resolution. FIG. 3A shows an IDT which can be manufactured using a manufacturing process with the same process resolution in use today but which allows for a doubled working frequency. The process resolution is the minimal size of a single element of the structure which it is possible to produce using the process.

In FIG. 3A, the IDT 300a comprises a substrate 301a. The substrate contains recesses and protrusions defining high and low adjacent lateral areas. The IDT 300a is shown in longitudinal cross-section, and it can be seen that the substrate, on the top surface, has undulations, and these extend laterally across the substrate. This can also be seen in FIG. 3B.

The protrusions contain first sets of electrodes 303a, disposed atop the substrate in respective high areas. These first electrodes 303a are connected to an input signal. Second electrodes 305a are disposed below the level of the protrusions, in the recesses and in-between each of the first electrodes 303a. The second electrodes 305a are connected to ground, or the second sets of alternate electrodes 305a can be connected to the opposite side of the signal input, i.e., the IDT could be connected to a signal input which is not connected to ground.

In the prior art acoustic wave IDTs 100a to 100f, the duty factor, which is the ratio of the space between leading edges of adjacent electrodes that is taken up by an electrode, is approximately 0.5. This means that the gap between electrodes is equal to the width of an electrode. In the improved IDT 300a the duty factor is 1 or very close to 1. Because nodes and antinodes of the symmetrical waveform, and indeed all nodes of the asymmetrical waveform, are generated at each electrode, decreasing the space between electrodes decreases the wavelength of the propagated wave. Using the relationship between wavelength, speed and frequency:

$$f = \frac{v}{\lambda}$$

it can be readily seen that if the wavelength is decreased, the frequency of the wave increases.

Figure 3B:
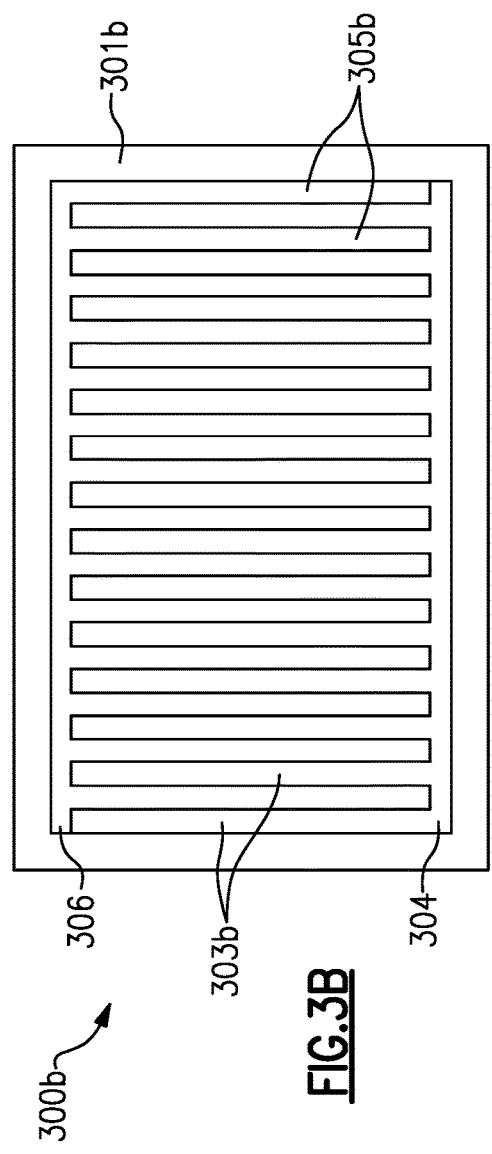
FIG. 3B is a plan view of an improved IDT according to an aspect of the present disclosure.

FIG. 3B shows a plan view of the IDT of FIG. 3A. The substrate 301b is shown with the electrodes disposed atop the substrate. It can be seen from the plan view that the first set of electrodes 303b are connected to a busbar 304, and the second set of electrodes 305b are connected to a busbar 306. It can be seen that the interleaved electrodes are substantially adjacent, which is not the case with any of the prior art acoustic wave devices. Because of this, the working frequency of the acoustic wave IDT 300a is double that of the prior art acoustic wave IDT 100a.

Figure 3C:
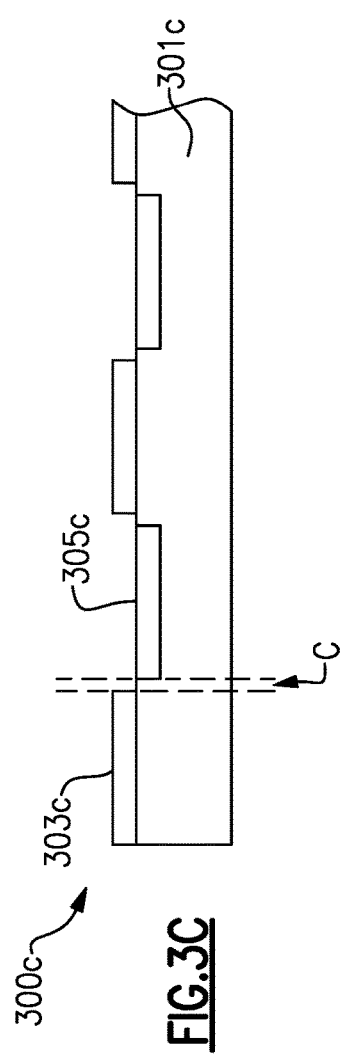
FIG. 3C is a close up of an improved IDT according to an aspect of the present disclosure.

FIG. 3C shows a close up of the IDT 300a showing a small gap between each electrode. This can be useful for preventing electrical shorting of the electrodes with opposite potentials, as each adjacent electrode may be connected to either side of the incoming signal. From acoustic wave generation (piezoelectric coupling coefficient) and propagation (propagation loss factor) points of view it is better to reduce this gap between the electrodes. Too narrow a gap, however, may lead to discharge between electrodes because of the high gradient or distribution of electric field which occurs in the gap region. This gap may be important especially for high power devices used in transmitters. Other methods of achieving this separation are possible, such as providing an insulated section instead of the gap.

If the gap width c is less than or equal to 0.01 wavelengths of the propagated acoustic wave, then the duty factor of the electrodes of the improved IDT shown in FIG. 3A is 0.98 or greater. If the gap between leading edges of two adjacent electrodes is 0.5 wavelengths, and the gap width c between adjacent edges of adjacent electrodes is equal to 0.01 wavelengths or less, then each electrode takes up a space of 0.49 wavelengths. Calculating the duty factor using these figures gives:

$$df = \frac{0.49}{0.5} = 0.98$$

The maximum height of the substrate, i.e., beneath the first electrodes 303c, in this example is between 0.1 and 1 wavelengths, for example, 0.3 wavelengths, and the height of each IDT electrode is between 0.01 and 0.5 wavelengths, for example, 0.03 wavelengths. The duty factor can be anywhere from 0.8 to 0.98.

FIG. 3D shows an embodiment of the acoustic wave IDT as described above but with additional third and fourth sets of electrodes 3003d and 3005d disposed on the underside of the substrate 301d, which are essentially mirrored with respect to the electrodes 303d and 305d. Similarly, FIG. 3E shows a mirrored acoustic wave IDT but with the positions of the electrodes 3003e and 3005e on the underside of the substrate 301e offset by one electrode width, such that each "high" electrode 303e is mirrored by a "low" electrode 3005e. This can increase piezoelectric coupling.

The frequency benefits, as well as other benefits of the IDT 300a are shown in FIG. 4. The A0 407, S0 408, and A1 409 waves are shown which belong to the prior art acoustic wave IDT 100a. Furthermore, the A0 410 and S0 411 are shown which belong to the improved acoustic Lamb wave generated by the new proposed IDT structure 300a. The S0 wave 410 propagated by the improved IDT has a frequency of around 7.9 GHz.

Furthermore, the quality factor (Q) is improved over the prior art acoustic wave IDT, and as well as this there is a 30 dB impedance decrease in the acoustic wave device comprising the IDT 300a. This results in a more efficient circuit incorporating the improved acoustic wave IDT. The reduction in impedance is caused by an increased parallel capacitance between the electrodes, as they are closer together than in the prior art acoustic wave devices 100a to 100f. As the capacitance increases the capacitive impedance decreases, as per the relationship:

$$z = \frac{1}{2\pi f C}$$

where c is the capacitance, f is the wave frequency, and z is the impedance.

In the specific example described and shown with respect to FIG. 4, the maximum height of the substrate is 0.3 wavelengths, and the height of each IDT electrode is 0.03 wavelengths. With the particular size and pitch of the electrodes the wavelength of the generated acoustic wave is 2 μm and as discussed above the duty factor is 0.98. Other sizes, pitches and duty factors however are useful for different implementations, in particular frequency ranges from 10 Mhz to 20 GHz. A different substrate height will provide a different wave amplitude, and a different pitch and duty factor will produce a different frequency of wave. The width of each electrode can also be varied, to keep the advantageous duty factor yet increase or decrease slightly the frequency of the wave. The thickness of the electrodes can also be changed, and a thicker electrode can result in an improved coupling coefficient.

A method of manufacturing an improved IDT such as the IDT 300a is shown and described with reference to FIGS. 5A to 5E. A benefit of the IDT is in that to be manufactured only one alignment of the device must be made.

In FIG. 5A a substrate 501a is provided. This will be provided on a wafer in a milling/depositing machine. The substrate is made of aluminum nitride in one of a number of specific compositions, or can also be made from any number of other materials such as doped aluminum nitride, in particular scandium doped aluminum nitride, zinc oxide, lithium niobite, or any suitable piezoelectric material. The substrate is approximately 0.3 wavelengths of the expected propagated waves in thickness.

In FIG. 5B a film of aluminum to form an IDT layer 503b is applied to the substrate. This aluminum will form the IDTs 303a, on the high level substrate shown in FIG. 3A. The IDTs may not be made from aluminum, and can be instead made from any number of other materials such as molybdenum, tungsten, copper, gold, silver, platinum, ruthenium, or iridium. This IDT material 503b is disposed on the entire surface of the substrate, but may exclude a perimeter area of the substrate 501b depending on the application of the IDT.

In FIG. 5C, which shows a plan view, a mask 513c is applied to the IDT layer, which leaves a negative space 515c. As the entire substrate 501c has been coated with the IDT layer, the negative space 515c can be milled out using conventional methods to remove this layer and a layer of equivalent thickness from the substrate 501c to leave a first set of electrodes beneath the mask. After this, a second IDT layer can be applied to the negative space 515c, creating a second set of electrodes on this lower level of the substrate. Manufacturing tolerances of the deposition apparatus can allow for the small gap c shown in FIG. 3C.

In FIG. 5D, a cross-section is once again shown which shows the IDT once the negative IDT layer, and equivalent thickness of substrate, has been removed. FIG. 5D does not show the mask, which is still applied at this point. All that remains is a substrate 501d (with the perimeter area as discussed above) and the first set of electrodes 503d.

FIG. 5E shows the IDT once the second IDT layer has been applied to the negative area, with the second set of electrodes 505e formed in the space removed in the previous step. The IDT is therefore fully formed with first and second sets of electrodes 503e and 505e disposed on the substrate 501e, with the first set of electrodes 503a being disposed on the surface of the substrate 501e and the second set of electrodes 505e being disposed below the original surface of the substrate 501e.

Alternative methods of fabrication can be employed, which have the same benefit as the above method, in that the device only needs to be aligned once to construct the improved IDT. For instance, a mask can be applied to the substrate before any IDT layer is applied, and the substrate can then be etched directly, and the whole substrate then coated with the IDT layer. This will fill in the etched portions of the substrate as well as cover the non-etched portions to create the two sets of IDTs. The IDT can then be finished by etching, polishing or grinding to achieve a uniform thickness of IDT above the substrate, creating the illustrated IDT 300a.

Furthermore, using both positive and negative photoresist etching, one mask may be used to apply an IDT layer both below and above the substrate.

While the IDTs above are described with reference to general acoustic wave devices, the IDT technology can be applied to, for instance, a Lamb wave device, a SAW wave device, or BAW wave device, or a resonator or other similar IDT based device.

Figure 6:
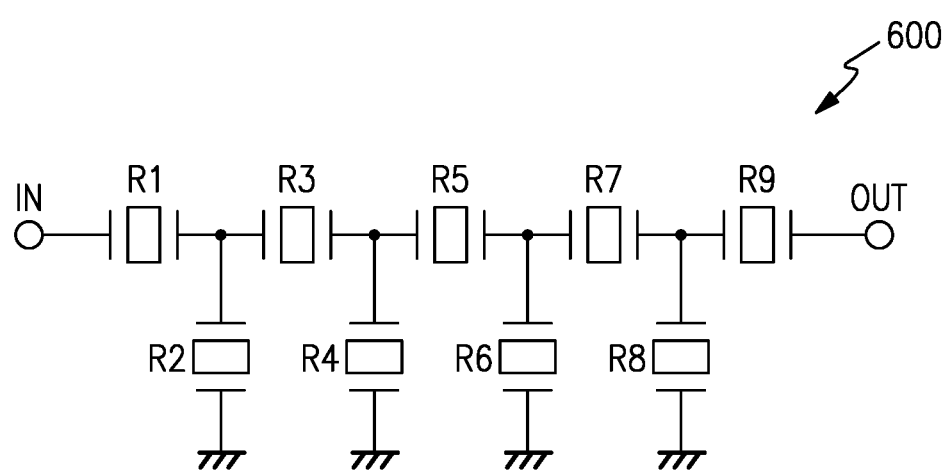
FIG. 6 shows an example of a ladder filter in which multiple acoustic wave devices according to aspects of the present disclosure may be combined.

FIG. 6 shows an example of a ladder filter 600 in which multiple acoustic wave devices incorporating the improved IDT 300a as disclosed herein may be combined. FIG. 6 shows an RF ladder filter 600 including a plurality of series acoustic wave resonators including the IDT 300a R1, R3, R5, R7, and R9, and a plurality of parallel (or shunt) acoustic wave devices R2, R4, R6, and R8. As shown, the plurality of series acoustic wave devices R1, R3, R5, R7, and R9 are connected in series between the input and the output of the RF ladder filter, and the plurality of parallel acoustic wave devices R2, R4, R6, and R8 are respectively connected between series acoustic wave devices and ground in a shunt configuration. Other filter structures and other circuit structures known in the art that may include acoustic wave devices, for example, duplexers, multiplexors, switches, modulators, oscillators, etc., may also be formed including examples of acoustic wave filters disclosed herein.

Figure 7:
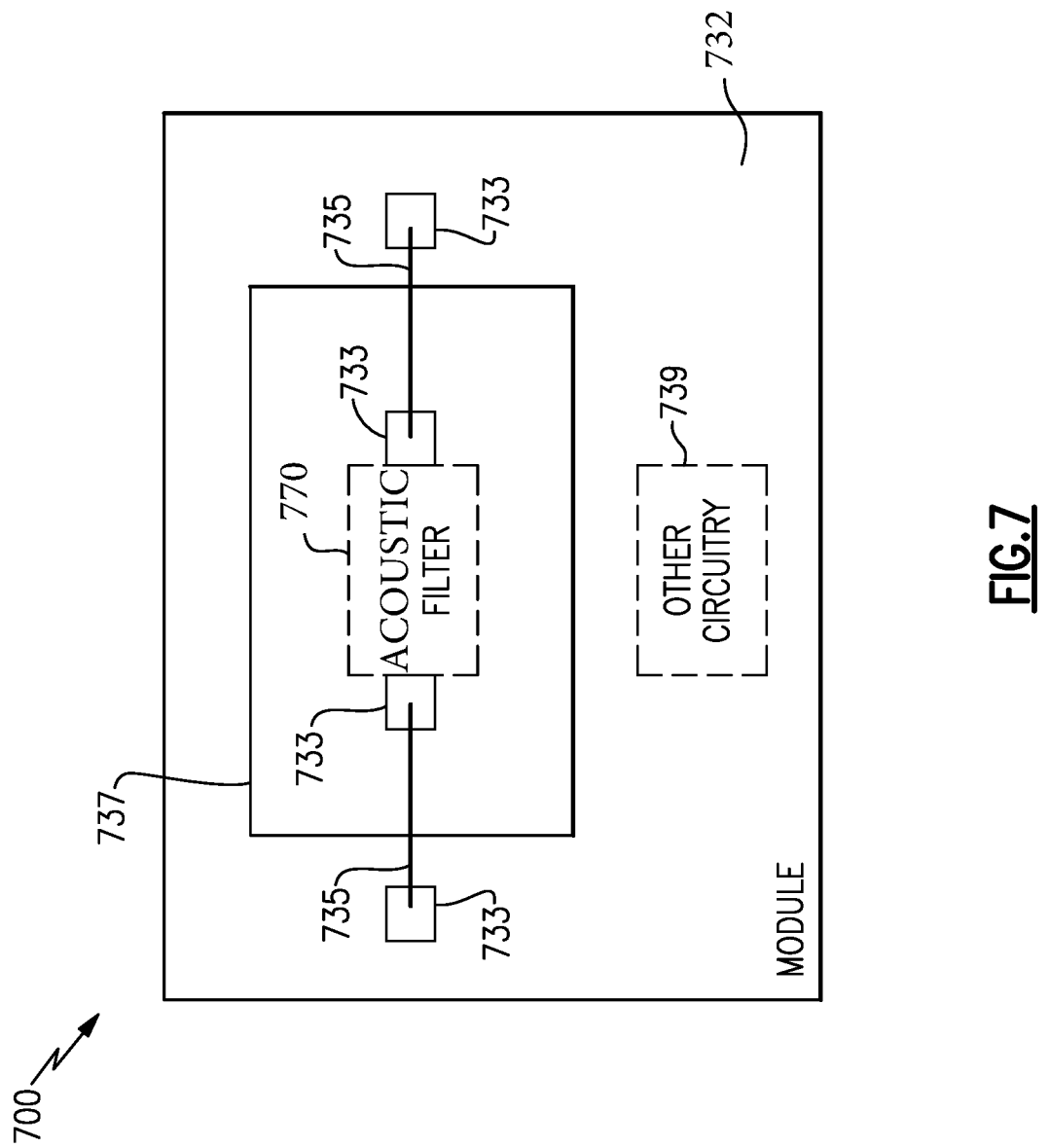
FIG. 7 is a block diagram of one example of a filter module that can include one or more acoustic wave devices according to aspects of the present disclosure.
Figure 8:
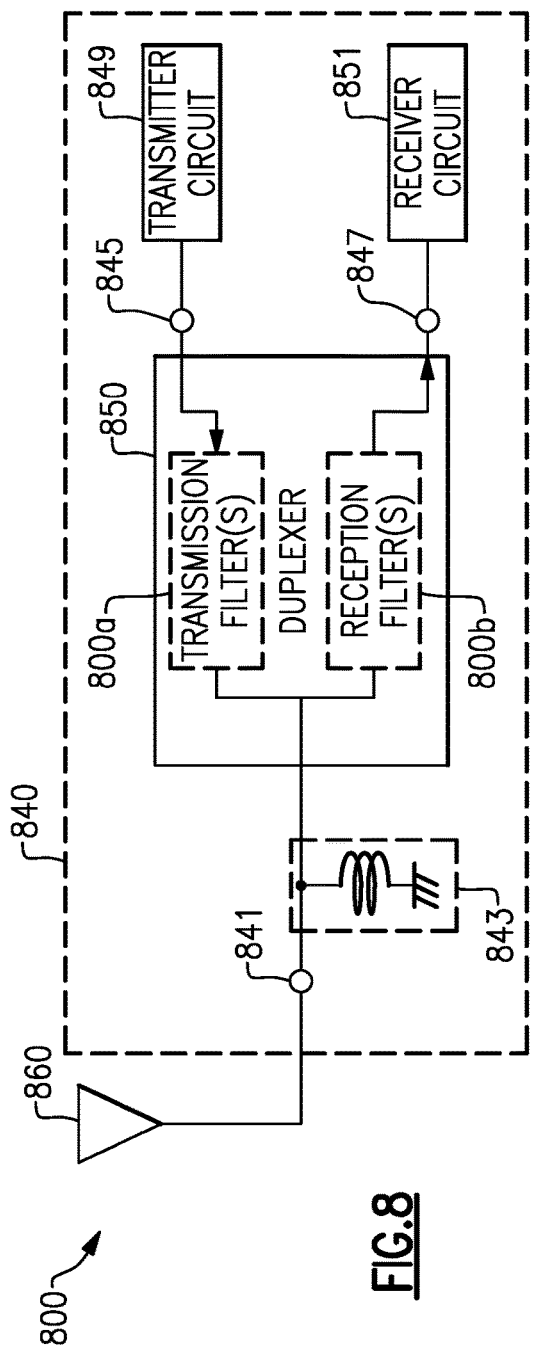
FIG. 8 is a block diagram of one example of a front-end module that can include one or more filter modules including acoustic wave devices according to aspects of the present disclosure.
Figure 9:
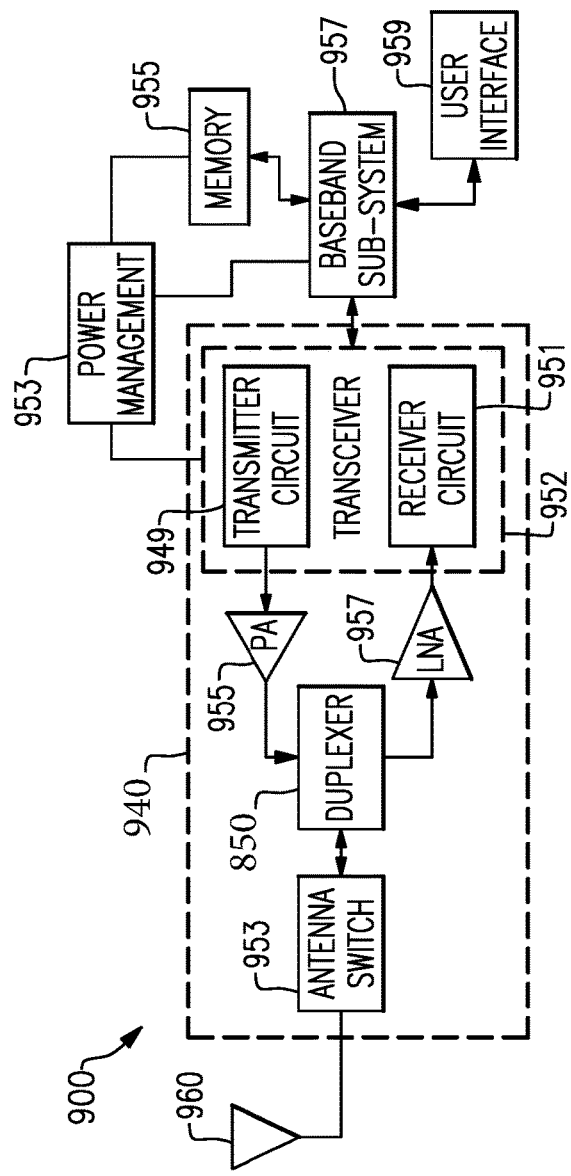
FIG. 9 is a block diagram of one example of a wireless device including the front-end module of FIG. 8.

Moreover, examples and embodiments of acoustic wave devices discussed herein can be implemented in a variety of packaged modules. Some example packaged modules will now be discussed in which any suitable principles and advantages of the acoustic wave devices discussed herein can be implemented. FIGS. 7, 8, and 9 are schematic block diagrams of illustrative packaged modules and devices according to certain embodiments.

Acoustic wave devices, such as those of FIGS. 3A and 5E may be incorporated into and packaged as a module that may ultimately be used in an electronic device, such as a wireless communications device, for example. FIG. 7 is a block diagram illustrating one example of a module 700 including acoustic wave filter 770. The acoustic wave filter 770 may be implemented on one or more die(s) 737 including one or more connection pads 733. For example, the acoustic wave filter 770 may include a connection pad 733 that corresponds to an input contact for the acoustic wave filter and another connection pad 733 that corresponds to an output contact for the acoustic wave filter. The packaged module 700 includes a packaging substrate 732 that is configured to receive a plurality of components, including the die 737. A plurality of connection pads 733 can be disposed on the packaging substrate 732, and the various connection pads 733 of the acoustic wave filter die 737 can be connected to the connection pads 733 on the packaging substrate 732 via electrical connectors 735, which can be solder bumps or wirebonds, for example, to allow for passing of various signals to and from the acoustic wave filter 770. The module 700 may optionally further include other circuitry die 739, for example, one or more additional filter(s), amplifiers, pre-filters, modulators, demodulators, down converters, and the like, as would be known to one of skill in the art of semiconductor fabrication in view of the disclosure herein. In some embodiments, the module 700 can also include one or more packaging structures to, for example, provide protection and facilitate easier handling of the module 700. Such a packaging structure can include an overmold formed over the packaging substrate 732 and dimensioned to substantially encapsulate the various circuits and components thereon.

Various examples and embodiments of the acoustic wave filter 770 can be used in a wide variety of electronic devices. For example, the acoustic wave filter 770 can be used in an antenna duplexer, which itself can be incorporated into a variety of electronic devices, such as RF front-end modules and communication devices.

Referring to FIG. 8, there is illustrated a block diagram of one example of a front-end module 840, which may be used in an electronic device such as a wireless communications device (e.g., a mobile phone) for example. The front-end module 840 includes an antenna duplexer 850 having a common node 841, an input node 845, and an output node 847. An antenna 860 is connected to the common node 841.

The antenna duplexer 850 may include one or more transmission filters 800a connected between the input node 845 and the common node 841, and one or more reception filters 800b connected between the common node 841 and the output node 847. The passband(s) of the transmission filter(s) are different from the passband(s) of the reception filters. Examples of the acoustic wave filter 770 can be used to form the transmission filter(s) 800a and/or the reception filter(s) 800b. An inductor or other matching component 843 may be connected at the common node 841.

The front-end module 840 further includes a transmitter circuit 849 connected to the input node 845 of the duplexer 850 and a receiver circuit 851 connected to the output node 847 of the duplexer 850. The transmitter circuit 849 can generate signals for transmission via the antenna 860, and the receiver circuit 851 can receive and process signals received via the antenna 860. In some embodiments, the receiver and transmitter circuits are implemented as separate components, as shown in FIG. 8, however, in other embodiments these components may be integrated into a common transceiver circuit or module. As will be appreciated by those skilled in the art, the front-end module 840 may include other components that are not illustrated in FIG. 8 including, but not limited to, switches, electromagnetic couplers, amplifiers, processors, and the like.

FIG. 9 is a block diagram of one example of a wireless device 900 including the antenna duplexer 850 shown in FIG. 8. The wireless device 900 can be a cellular phone, smart phone, tablet, modem, communication network or any other portable or non-portable device configured for voice or data communication. The wireless device 900 can receive and transmit signals from the antenna 960. The wireless device includes an embodiment of a front-end module 940 similar to that discussed above with reference to FIG. 8. The front-end module 940 includes the duplexer 850, as discussed above. In the example shown in FIG. 9 the front-end module 940 further includes an antenna switch 953, which can be configured to switch between different frequency bands or modes, such as transmit and receive modes, for example. In the example illustrated in FIG. 9, the antenna switch 953 is positioned between the duplexer 850 and the antenna 960; however, in other examples the duplexer 850 can be positioned between the antenna switch 953 and the antenna 960. In other examples the antenna switch 953 and the duplexer 850 can be integrated into a single component.

The front-end module 940 includes a transceiver 952 that is configured to generate signals for transmission or to process received signals. The transceiver 952 can include the transmitter circuit 949, which can be connected to the input node of the duplexer 850, and the receiver circuit 951, which can be connected to the output node of the duplexer 850, as shown in the example of FIG. 9.

Signals generated for transmission by the transmitter circuit 949 are received by a power amplifier (PA) module 955, which amplifies the generated signals from the transceiver 952. The power amplifier module 955 can include one or more power amplifiers. The power amplifier module 955 can be used to amplify a wide variety of RF or other frequency-band transmission signals. For example, the power amplifier module 955 can receive an enable signal that can be used to pulse the output of the power amplifier to aid in transmitting a wireless local area network (WLAN) signal or any other suitable pulsed signal. The power amplifier module 955 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 955 and associated components including switches and the like can be fabricated on gallium arsenide (GaAs) substrates using, for example, high-electron mobility transistors (pHEMT) or insulated-gate bipolar transistors (BiFET), or on a silicon substrate using complementary metal-oxide semiconductor (CMOS) field effect transistors.

Still referring to FIG. 9, the front-end module 940 may further include a low noise amplifier (LNA) module 957, which amplifies received signals from the antenna 860 and provides the amplified signals to the receiver circuit 951 of the transceiver 952.

The wireless device 900 of FIG. 9 further includes a power management sub-system 953 that is connected to the transceiver 952 and manages the power for the operation of the wireless device 900. The power management system 953 can also control the operation of a baseband sub-system 957 and various other components of the wireless device 900. The power management system 953 can include, or can be connected to, a battery (not shown) that supplies power for the various components of the wireless device 900. The power management system 953 can further include one or more processors or controllers that can control the transmission of signals, for example. In one embodiment, the baseband sub-system 957 is connected to a user interface 959 to facilitate various input and output of voice and/or data provided to and received from the user. The baseband sub-system 957 can also be connected to memory 955 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 20 GHz.

Further examples of the electronic devices that aspects of this disclosure may be implemented include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. An interdigital transducer with increased propagation frequency comprising:
   a substrate for propagation of acoustic waves including a first surface having alternating first high and first low surface portions extending laterally across the substrate;
   a set of elongate first electrodes, each elongate first electrode disposed on a respective first high surface portion of the substrate and connected by a first busbar that is disposed on a second high surface portion of the substrate extending longitudinally across the substrate; and
   a set of elongate second electrodes, each elongate second electrode disposed on a respective first low surface portion of the substrate and connected by a second busbar that is disposed on a second low surface portion of the substrate extending longitudinally across the substrate, the elongate first and second electrodes being alternately adjacent to one another, the first high and first low surface portions of the substrate being substantially equal in width to each elongate electrode of the sets of elongate first and second electrodes, a gap being defined longitudinally between each adjacent elongate electrode.

2. The interdigital transducer of claim 1 further comprising a second surface having alternating high and low surface portions extending laterally across the substrate.

3. The interdigital transducer of claim 2 further comprising a set of elongate third electrodes, each elongate third electrode disposed on a respective high surface portion of the second surface.

4. The interdigital transducer of claim 3 further comprising a set of elongate fourth electrodes, each elongate fourth electrode disposed on a respective low surface portion of the second surface, such that the elongate third and fourth electrodes are alternately adjacent to one another, the high and low surface portions of the second surface being substantially equal in width to each elongate electrode of the elongate third and fourth sets of electrodes.

5. The interdigital transducer of claim 1 wherein a duty factor of the elongate electrodes disposed on the substrate is between 0.8 and 0.98.

6. The interdigital transducer of claim 1 wherein the gap is smaller than 0.01 wavelengths of the acoustic waves.

7. The interdigital transducer of claim 1 wherein the substrate is made of any one of aluminum nitride, doped aluminum nitride, scandium doped aluminum nitride, zinc oxide, lithium niobite, or any suitable piezoelectric material.

8. The interdigital transducer of claim 1 wherein the sets of elongate first and second electrodes are made of any one of aluminum, tungsten, copper, gold, silver, platinum, ruthenium, molybdenum, or other metals.

9. The interdigital transducer of claim 8 wherein any one of the sets of elongate electrodes are made of a different material to any of the other sets of elongate electrodes.

10. The interdigital transducer of claim 1 wherein the substrate has a thickness equal to 0.1 to 1 times a wavelength of the acoustic waves.

11. The interdigital transducer of claim 10 wherein the thickness of the substrate is equal to 0.3 times the wavelength of the acoustic waves.

12. The interdigital transducer of claim 1 wherein each elongate electrode has a thickness equal to 0.01 to 0.5 times a wavelength of the acoustic waves.

13. The interdigital transducer of claim 12 wherein the thickness of each elongate electrode is equal to 0.03 times the wavelength of the acoustic waves.

14. A terminal comprising a filter including an interdigital transducer according to claim 1.

15. A method of providing a high frequency wave within an interdigital transducer comprising:
  placing a first set of electrodes on a first high surface portion of a substrate, the first set of electrodes connected by a first busbar that is disposed on a second high surface portion of the substrate that extends longitudinally across the substrate; and
  placing a second set of electrodes interleaved with the first set of electrodes on a first low surface portion of the substrate, the second set of electrodes connected by a second busbar that is disposed on a second low surface portion of the substrate that extends longitudinally across the substrate, such that electrodes of the first and second sets are alternately adjacent to one another, such that space between the electrodes of the first set of electrodes is substantially filled by the electrodes of the second set of electrodes, and such that a gap is defined longitudinally between each adjacent electrode.

16. A method of manufacturing an interdigital transducer with increased propagation frequency comprising:
  depositing a first interdigital transducer layer to substantially cover a substrate;
  applying a mask having a positive and a negative area to the interdigital transducer layer, the mask forming a silhouette of an interdigital transducer electrode set including elongate first electrodes in the positive area and forming an interleaving silhouette of an interdigital transducer electrode set including elongate second electrodes in the negative area;
  forming the set of elongate first electrodes on a surface of the substrate, the set of elongate first electrodes connected by a first busbar that is disposed on the surface of the substrate and that extends longitudinally across the substrate by removing the interdigital transducer layer exposed by the negative area by etching;
  defining a first high surface portion of the substrate upon which the set of elongate first electrodes are disposed and a second high surface portion of the substrate on which the first busbar is disposed, and defining first and second low surface portions of the substrate by removing a layer of substrate approximately equal to a thickness of the interdigital transducer layer exposed by the negative area by etching; and
  forming the set of elongate second electrodes, each second electrode disposed on a respective first low surface portion of the substrate and connected by a second busbar that is disposed on the second low surface portion of the substrate and that extends longitudinally across the substrate such that the first and second electrodes are alternately adjacent to one another, the first high and first low surface portions of the substrate being substantially equal in width to each electrode of the first and second sets of electrodes, a gap being defined longitudinally between each adjacent electrode, by depositing a second interdigital transducer layer on the first and second low surface portions of the substrate.

17. The method of claim 16 wherein the depositing the second interdigital transducer layer comprises leaving a gap equal to approximately 1/50 of the width of each interdigital transducer electrode of the interdigital transducer electrode sets around a perimeter of the negative area of the mask where no second interdigital transducer layer is deposited.

* * * * *